United States Patent [19]

Cunningham

[11] 4,132,945
[45] Jan. 2, 1979

[54] SYSTEM FOR ALIGNING WHIP ANTENNA MATCHING BASE UNITS

[75] Inventor: Peter E. Cunningham, Ocean, N.J.

[73] Assignee: The United States of America as represented by the Secretary of the Army, Washington, D.C.

[21] Appl. No.: 864,885

[22] Filed: Dec. 27, 1977

[51] Int. Cl.² .......................................... G01R 27/04
[52] U.S. Cl. ................................................ 324/58 C
[58] Field of Search ............ 324/58 C, 58.5 C, 58.5 A

[56] References Cited
U.S. PATENT DOCUMENTS

| 2,424,249 | 7/1947 | Miller | 324/58 C |
| 3,684,952 | 8/1972 | Lundstrom | 324/58.5 A X |
| 3,953,796 | 4/1976 | Keller | 324/58 C X |

Primary Examiner—Stanley T. Krawczewicz
Attorney, Agent, or Firm—Nathan Edelberg; Sheldon Kanars; Daniel D. Sharp

[57] ABSTRACT

A system for setting the admittances of matching base units for use with whip antennas wherein the matching base unit is placed across a cavity resonator which is first calibrated in accordance with the admittances of a standard matching base unit through a range of prescribed frequencies and thereafter aligning the admittances of production model matching base units over the same range of frequencies in accordance with the previously calibrated or aligned cavity resonator.

12 Claims, 5 Drawing Figures

SYSTEM FOR ALIGNING WHIP ANTENNA MATCHING BASE UNITS

BACKGROUND OF THE INVENTION

This invention relates to whip antennas and more particularly to a circuit and method for accurately adjusting and aligning the whip antenna matching base unit to maintain proper and constant values of both the admittance measured across the matching base unit and the input impedance of the antenna.

Whip antennas are well known for use as vehicular antennas for ground tactical VHF-FM radio sets. One such typical antenna is shown in FIG. 1. It comprises an upper dipole element 10, usually a straight conductor, and a lower coaxial dipole element 12 terminated by a matching base unit 14 which includes a helical coaxial sleeve choke 16 and selective shunt reactances 18. The whip antenna of FIG. 1 is fed at point A of the matching base unit 14 and the coaxial dipole element 12 is connected from point B to ground through selective shunt reactances 18 as shown. The frequency range of operation for the communication equipment usually requires fixed tuning over several discrete bands to cover the entire communication range. For example, a system may require an operational range of 30 to 76 MHz which may be divided into ten discrete frequency ranges. It is the function of the matching base unit 14 to maintain the proper input matching impedance at antenna feed point A, and also the proper admittance measured from B to ground through one of the reactances 18 for each of the preselected frequency ranges. Heretofore, when such matching base units were manufactured for use with a whip antenna, the combined matching base unit 14 and antenna dipoles 10 and 12 were utilized to adjust the impedance at antenna feed point A of the matching base unit 14 in accordance with a calibrated standard. The tuning adjustments of the shunt reactances 18 were made so that the impedance at feed point A equalled the calibrated value for each discrete frequency range of operation. However, it was found that this procedure proved to be unsatisfactory since it resulted in widely varying values for both admittance and impedance during actual operation of the antenna over the entire frequency range. Moreover, the chamber in which the combined antenna and matching base unit was placed to provide such impedance measurements had to be rather long to include both the antenna and the matching base unit. Such a chamber proved to be rather unwieldy and expensive to make.

BRIEF SUMMARY OF THE INVENTION

In accordance with the present invention, the system for setting the admittances of a whip antenna matching base unit having multiple adjustable reactances adapted to operate selectively over discrete frequency ranges includes a metallic cavity resonator provided with multiple shunt reactances similar to those in the matching base unit. The matching base unit is centrally positioned within the cavity resonator with one end electrically insulated therefrom. Included further more means connected across the input and output ports of the cavity for indicating the admittances over the discrete frequency ranges of the matching base unit mounted within the cavity.

The present invention is also directed to the method of setting the admittances of a whip antenna matching base unit. It includes the steps of aligning the metallic cavity resonator in accordance with a standard matching base unit mounted within the cavity such that, for each frequency range, respective shunt reactances of the cavity are aligned with respective preset reactances of the standard matching base unit and indicating for each frequency range when such alignment occurs. Production matching base unit models are then substituted for the standard unit and the discrete shunt reactances of the production models are adjusted until proper setting is indicated in accordance with the previously aligned cavity shunt reactances for each discrete frequency range.

DETAILED DESCRIPTION OF THE INVENTION

Figure 1:
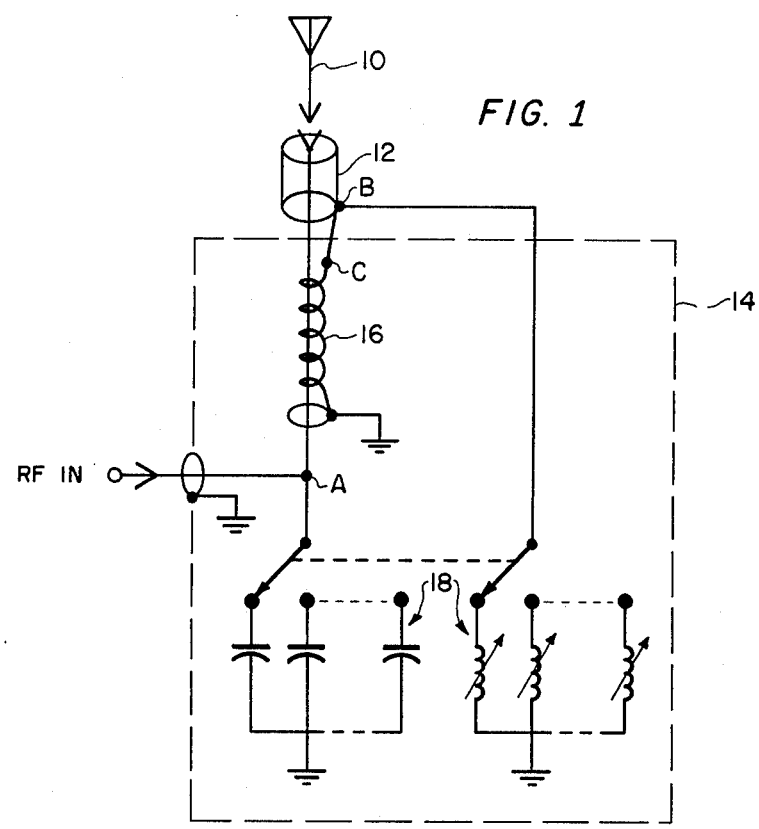
FIG. 1 is a schematic representation of a conventional whip antenna with a matching base unit.
Figure 2:
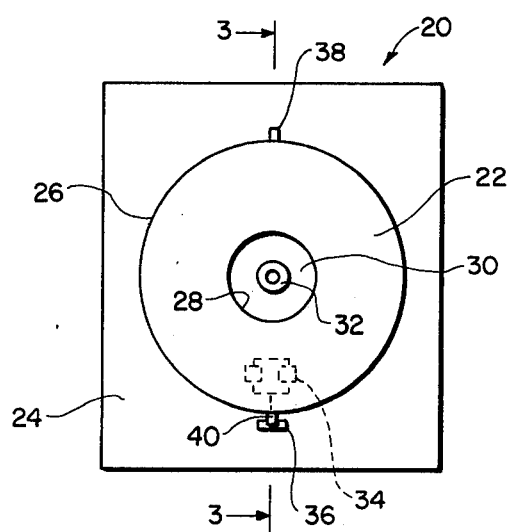
FIG. 2 is a top plan view of the alignment cavity.
Figure 3:
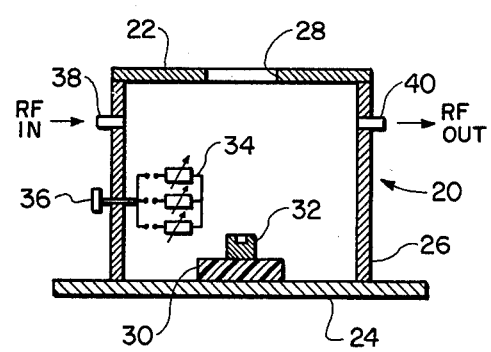
FIG. 3 is a cross-section of the alignment cavity of FIG. 2 taken along the lines 3—3.
Figure 4:
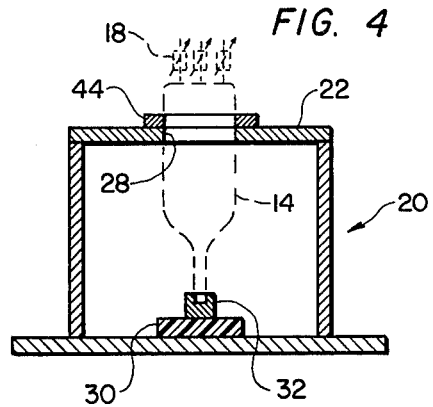
FIG. 4 illustrates the position of the matching base unit within the alignment cavity.

Referring now to FIGS. 2 and 3 of the drawings, at 20 there is shown a cylindrical cavity resonator dimensioned so as to be operational over the entire frequency range of operation. Cavity resonator 20 comprises top and bottom plates 22 and 24 and cylindrical wall 26 intermediate the plates 22 and 24. As shown, upper plate 22 is provided with a central aperture 28 which is directly opposite an insulator disc 30 mounted within cavity 20 on lower plate 24. A centrally positioned metallic connector 32 is mounted on insulator disc 30. Also mounted within cavity 20 are a series of parallel arranged shunt reactances 34 adapted to be connected from metallic connector 32 to ground by means of band selector switch 36. Discrete input and output ports 38 and 40 are provided as shown for connection to the circuit test equipment as explained below. FIG. 4 illustrates the positioning of a matching base unit 14 within the cavity 20. The adjustable reactances 18 are affixed at one end to a matching base unit mounting flange 44 which fits over aperture 28 and makes contact with top plate 22. The other end of the matching base unit is the terminus of choke 16 of FIG. 1 and which is positioned within metallic connector 32. By such an arrangement, the adjustable shunt reactances 18 are accessible above top plate 22 of cavity 20 for easy adjustment.

Figure 5:
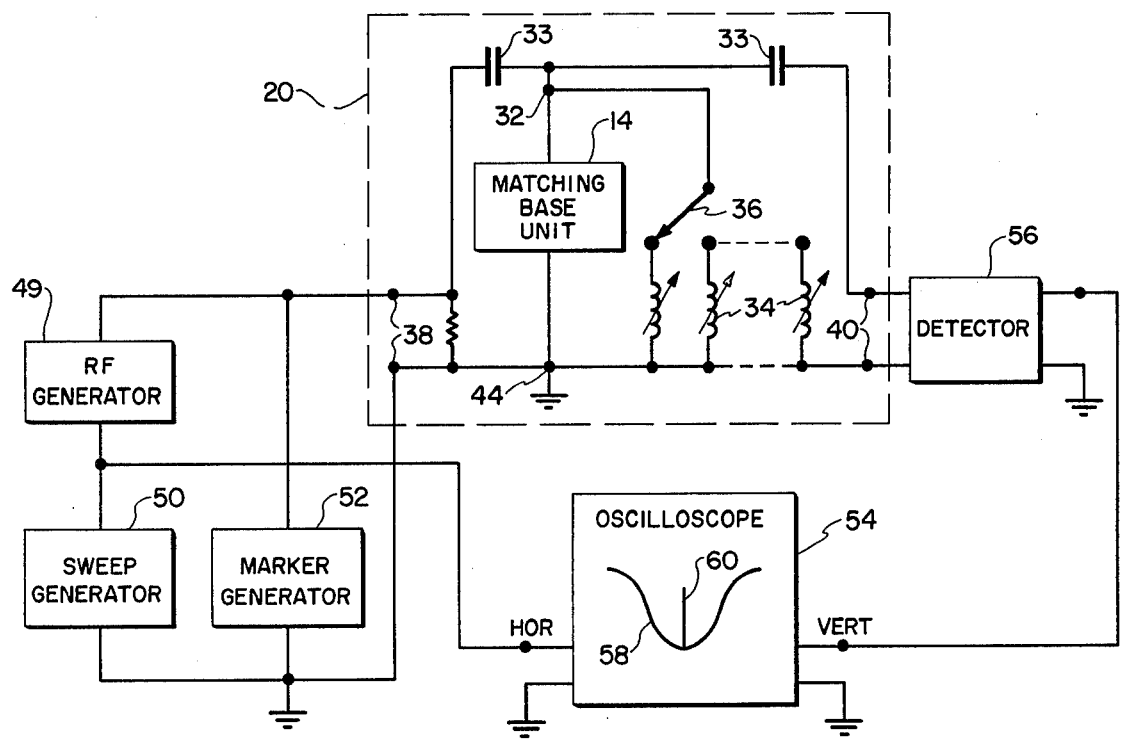
FIG. 5 is a schematic representation of the circuitry required to calibrate the alignment cavity and matching base units.

Cavity resonator 20 is connected to a test circuit as shown in FIG. 5 to provide for calibrating and setting the admittance of the matching base units hereinabove described. Referring now to FIG. 5, cavity resonator 20, hereinafter referred to as the alignment cavity, is shown schematically with like reference numbers referring to like elements. As shhown in FIG. 4, the antenna matching base 14 is positioned over center aperture 28 so that the metal mounting flange 14 of matching base unit 14 contacts upper plate 22 of cavity 20 and the terminal of matching base unit 14 (C of FIG. 1) makes contact with metallic connector 32 of cavity 20. In the circuit of FIG. 5, the cavity adjustable shunt reactances 34 are shown as being connected from connector 32 to ground 44 by means of switch 36. Each one of the reactances 34 corresponds to a discrete range of operating frequency. In the example hereinabove described, ten reactances would be required to cover the ten discrete frequency ranges. As shown, the input port 38 of cavity 20 is connected to the outputs of RF generator 49 and a marker generator 52. A sweep generator 50 outputs is applied to the horizontal plates of oscilloscope 54 and also provides a calibrated sweep voltage applied to RF generator 49 for producing the required radio frequency sweep voltages. The output port 40 of cavity 20 is connected to the vertical plates of oscilloscope 54 through a detector 56 to provide a frequency response curve or envelope 58 on oscilloscope 54. The frequency response curve 58, together with the marker frequency, will provide an indication of the admittance across the matching base unit 14. The marker frequency is a reference frequency for centering the response curve 58 on oscilloscope 54. As an example, for an RF range of 30 to 34 MHz a marker frequency of 32 MHz is required to provide a centering marker as shown at 60. Since this procedure is well known in the art, no further explanation is believed necessary.

In the method of operation, the first step required is to calibrate alignment cavity 20 so that it may be used as a standard. A prefectly aligned antenna matching base unit 14 is inserted in aperture 28 as hereinabove described. The cavity band switch 36 and the band switch of the matching base unit 14 are both set to band 1, for example, and the marker generator 52 and RF generator 49 are set to the appropriate frequencies as explained above. The cavity shunt reactance 34 associated with band 1 is adjusted to display the marker 60 in the center of the frequency response curve 58 shown on oscilloscope 54. Band 1 for alignment cavity 20 is now calibrated correctly and the remaining bands for cavity 20 are similary aligned. A production or uncalibrated matching base unit 14 is now inserted in alignment cavity 20. Cavity band switch 36 and the band switch of the production matching base unit 14 are both set to band 1, for example, as hereinabove described, with the marker generator 52 and RF generator 49 set to the appropriate frequencies. The adjustment of the matching base unit shunt reactance 18 for band 1 is adjusted to display the marker 60 in the center of the frequency response curve 58 on oscilloscope 54. Band 1 in the production matching base unit is now aligned correctly. The other bands are similarly aligned.

Although cavity resonator 20 is shown as being cylindrical, it is to be understood that the shape is not critical and a square or rectangular cavity, adequately dimensioned, may also be used if so desired. While the system shown in the circuit of FIG. 5 has produced antenna matching base units with more consistent values of base admittances over a wide range of frequencies, the theory of operation is not clearly understood. However, the empirical results shows the system capable of achieving the consistent admittance values required for whip antenna matching base units and simultaneously also provide a consistent antenna impedance value.

What is claimed is:

1. A system for setting the admittances of a whip antenna matching base unit having multiple adjustable shunt reactances adapted to operate selectively over a discrete frequency range comprising:
   a metallic cavity resonator having an input and output port and including multiple adjustable reactances adapted to operate selectively over said discrete frequency range,
   means for mounting said matching base unit centrally within said cavity with one end of said matching base unit electrically insulated from said cavity; and
   means connected between said input and output ports for indicating the admittance over said frequency range of said matching base unit mounted within said cavity.

2. The system in accordance with claim 1 wherein said cavity comprises a cylindrical wall intermediate top and bottom plates.

3. The system in accordance with claim 2 wherein said cavity adjustable reactances are connected between said insulated end and ground.

4. The system in accordance with claim 2 wherein the top plate of said cavity includes a circular aperture and wherein said bottom plate includes an insulator disc mounted thereon within said cavity and opposite said aperture.

5. The system in accordance with claim 4 wherein said cavity adjustable shunt reactances are connected between said insulated end and ground.

6. The system in accordance with claim 5 and wherein said matching base unit is mounted within said cavity between said aperture and said insulator, a metallic connector on said insulator, said matching base unit being in contact with said top plate and said connector.

7. The system in accordance with claim 1 wherein said last mentioned means comprises a sweep generator, an RF generator, and a marker generator connected to said input port, detector means connected to said output port, and means responsive to the output of said sweep generator and said detector means to produce the sweep frequency envelope and an indication of the marker frequency within said envelope, the admittance of said matching base unit being determined when said marker is in the center of said envelope.

8. The system in accordance with claim 7 wherein said frequency envelope producing means comprises an oscilloscope.

9. The system in accordance with claim 6 wherein the admittance indicating means comprises a sweep generator, an RF generator, and a marker generator connected to the input port of said cavity, detector means connected to the output port of said cavity, and an oscilloscope responsive to the output of said sweep generator and said detector means.

10. The method of setting the admittances of a whip antenna matching base unit having multiple shunt reactances adapted to operate selectively over a discrete frequency range comprising the steps of:
   aligning a metallic cavity resonator having respective shunt reactances in accordance with a standard matching base unit mounted within said cavity such that, for each frequency range, rspective shunt reactances of said cavity are aligned with respective preset reactances of said standard matching base unit,
   indicating for each frequency range when such alignment occurs,
   substituting production models of said matching base units for said standard unit; and
   adjusting the discrete shunt reactances of each of said production models until proper admittance setting is indicated in accordance with the previously aligned cavity shunt reactances for each frequency range.

11. The method in accordance with claim 10 wherein the alignment of said cavity resonator comprises the steps of:
  placing the standard matching base unit across the cavity resonator,
  applying an RF frequency and a marker frequency to said cavity,
  detecting the output of said cavity; and
  applying a sweep frequency and the detected output to an oscilloscope for indicating proper alignment when the marker frequency is at the center of the envelope on said oscilloscope.

12. The method in accordance with claim 10 wherein the proper adjustment of said matching base unit production models comprises the steps of:
  placing the production model unit across the cavity resonator,
  applying an RF frequency and a marker frequency to said cavity,
  detecting the output of said cavity; and
  applying a sweep frequency and the detected output to an oscilloscope for indicating proper adjustment when the marker frequency is at the center of the sweep envelope on said oscilloscope.

* * * * *